(12) United States Patent
Carrion et al.

(10) Patent No.: US 11,456,326 B2
(45) Date of Patent: Sep. 27, 2022

(54) PLENOPTIC CAMERA FOR MOBILE DEVICES

(71) Applicant: PHOTONIC SENSORS & ALGORITHMS, S.L., Valencia (ES)

(72) Inventors: Leticia Carrion, Valencia (ES); Jorge Blasco, Valencia (ES); Francisco Clemente, Valencia (ES); Francisco Alventosa, Valencia (ES); Arnau Calatayud, Valencia (ES); Carles Montoliu, Valencia (ES); Adolfo Martinez, Valencia (ES); Ivan Perino, Valencia (ES)

(73) Assignee: PHOTONIC SENSORS & ALGORITHMS, S.L., Valencia (ES)

( * ) Notice: Subject to any disclaimer, the term of this patent is extended or adjusted under 35 U.S.C. 154(b) by 13 days.

(21) Appl. No.: 16/980,590

(22) PCT Filed: Jun. 14, 2018

(86) PCT No.: PCT/EP2018/065883
§ 371 (c)(1),
(2) Date: Sep. 14, 2020

(87) PCT Pub. No.: WO2019/174758
PCT Pub. Date: Sep. 19, 2019

(65) Prior Publication Data
US 2021/0366968 A1    Nov. 25, 2021

(30) Foreign Application Priority Data

Mar. 15, 2018    (ES) .................................. 201800082

(51) Int. Cl.
*H01L 27/146*    (2006.01)
*H04N 5/225*    (2006.01)
(Continued)

(52) U.S. Cl.
CPC .... *H01L 27/14627* (2013.01); *G02B 13/0065* (2013.01); *H04N 5/22541* (2018.08); *H04N 5/23212* (2013.01)

(58) Field of Classification Search
CPC ........ H01L 27/14627; H01L 27/14625; G02B 13/0065; G02B 27/0075; G02B 13/0075;
(Continued)

(56) References Cited

U.S. PATENT DOCUMENTS 8,290,358 B1 * 10/2012 Georgiev ................ G03B 35/10
396/326
8,358,366 B1 * 1/2013 Georgiev ................ G02B 13/16
348/335

(Continued)

OTHER PUBLICATIONS

International Search Report and Written Opinion for Corresponding International Application No. PCT/EP2018/065883 (17 Pages) (dated Jan. 30, 2019).

*Primary Examiner* — Gevell V Selby
(74) *Attorney, Agent, or Firm* — Lucas & Mercanti, LLP

(57) ABSTRACT

A plenoptic camera for mobile devices is provided, having a main lens, a microlens array, an image sensor, and a first reflective element configured to reflect the light rays captured by the plenoptic camera before arriving at the image sensor, in order to fold the optical path of the light captured by the camera before impinging the image sensor. Additional reflective elements may also be used to further fold the light path inside the camera. The reflective elements can be prisms, mirrors or reflective surfaces of three-sided optical elements having two refractive surfaces that form a lens element of the main lens. By equipping mobile devices with this plenoptic camera, the focal length can be greatly increased while maintaining the thickness of the mobile device under current constraints.

23 Claims, 14 Drawing Sheets

(51) Int. Cl.
*G02B 13/00* (2006.01)
*H04N 5/232* (2006.01)

(58) Field of Classification Search
CPC ........... H04N 5/22541; H04N 5/23212; H04N 2013/0081; H04N 13/236; H04N 13/239; H04N 13/243; H04N 13/00
See application file for complete search history.

(56) References Cited

U.S. PATENT DOCUMENTS

| | | |
|---|---|---|
| 9,647,150 B2 | 5/2017 | Blasco |
| 2007/0077057 A1 | 4/2007 | Chang |
| 2007/0230944 A1* | 10/2007 | Georgiev ......... H04N 5/232125 396/322 |
| 2009/0296238 A1 | 12/2009 | Kakuta |
| 2013/0321668 A1* | 12/2013 | Kamath ............... H04N 5/2253 348/239 |
| 2019/0141226 A1* | 5/2019 | Lee .................... H04N 5/22541 |

* cited by examiner

PLENOPTIC CAMERA FOR MOBILE DEVICES

CROSS REFERENCE TO RELATED APPLICATION

This Application is a 371 of PCT/EP2018/065883, filed Jun. 14, 2018, which claims the benefit of Spanish Patent Application No. P201800082, filed Mar. 15, 2018, each of which are incorporated herein by reference.

TECHNICAL FIELD

The present invention is comprised in the field of microlens arrays, optical systems incorporating microlens arrays, light field images, light field cameras and plenoptic cameras.

Background Art

Plenoptic cameras are imaging devices capable of capturing not only spatial information but also angular information of a scene. This captured information is known as light-field which can be represented as a four-dimensional tuple LF(px,py,lx,ly), where px and py select the direction of arrival of the rays to the sensor and lx, ly are the spatial position of these rays. A plenoptic camera is typically formed by a microlens array placed in front of a sensor.

This system is equivalent to capturing the scene from several points of view (the so-called plenoptic views); therefore, a plenoptic camera can be considered a multi-view system. Another system that can capture a light-field can be formed by an array of several cameras. Accordingly, information about the depths of the different objects (i.e., the distance between the object itself and the camera) of the scene is captured implicitly in the light-field. This capability of plenoptic cameras entails a wide number of applications concerning the depth map generation and 3D imaging.

In 2012, Lytro introduced the first single-assembly plenoptic camera commercially available in the international market, and three years later, the Lytro Ilium camera. Since this, no other light-field cameras have been launched to the consumer electronics market. The Lytro first plenoptic camera had a mechanical size along the optical axis of 12 cm, and the Lytro Ilium camera had an objective lens (like the DSLR cameras) of more than 12 cm, and a total size of about 20 cm. The improved optics of the Lytro Ilium camera, with a dedicated objective zoom lens of five group of lenses, allowed the Ilium camera to beat in performance the first Lytro camera. After these two incursions in consumer cameras, Lytro moved to a very different market: the cinema market, producing extremely large cameras in which the length of the optical system can be dozens of centimetres, with sensors of 755 megapixels and extremely heavy solutions. These cameras are not hand-held cameras but professional movie maker cameras to be held by tripods or heavy mechanical structures.

Besides Lytro, Raytrix has also launched to the market several products based on light-field technology targeting industrial applications. These cameras are large cameras with large objective lenses that ensure a good depth estimation performance.

In conclusion, light-field cameras have demonstrated good performance in terms of 3D imaging and depth sensing. However, plenoptic cameras have never been brought to the mobile devices market due to the fact that they are really difficult to miniaturize. U.S. Pat. No. 9,647,150-B2 discloses a method of manufacturing miniaturized plenoptic sensors. However, as already explained, the smallest plenoptic camera launched to the consumer electronic market is the 12 cm Lytro camera.

Performance on plenoptic cameras depends on key optic design factors such as focal length and f-number, where a large focal length or a small f number can improve drastically the performance of the camera. Although small f numbers are easy to find in smartphone lenses, large focal lengths are very hard to design and manufacture fulfilling the smartphone market design rules due to the very small thicknesses of the modules that impose difficult constraints at the MTTL (Mechanical Total Track Length) of the cameras.

Besides, current smartphone market tends to reduce the dimensions of the mini cameras more and more each generation, increasing the difficulty to design large focal lengths. Therefore, there is a need to introduce the light-field technology into the smartphone market with an important increase in the focal length but at the same time fulfilling the mechanical constraints in terms of size of the smartphones.

Definitions:

Plenoptic camera: A device capable of capturing not only the spatial position but also the direction of arrival of the incident light rays.

Multiview system: System capable of capturing a scene from several points of view. A plenoptic camera can be considered a multiview system. Stereo and multi-stereo cameras are also considered multiview systems.

Light field: four-dimensional structure LF(px,py,lx,ly) that contains the information from the light captured by the pixels (px,py) below the microlenses (lx, ly) in a plenoptic camera.

Depth: distance between the plane of an object point of a scene and the main plane of the camera, both planes are perpendicular to the optical axis.

Plenoptic view: two-dimensional image formed by taking a subset of the light field structure by choosing a certain value (px, py), always the same (px, py) for every one of the microlenses (lx, ly).

Microlens array (MLA): array of small lenses (microlenses).

Depth map: two-dimensional image in which the calculated depth values of the object world are added as an additional value to every pixel (x,y) of the two-dimensional image, composing depth=f(x,y).

Disparity: Distance between two (or more) projections of an object point into a camera.

Baseline: Difference between the position of two (or more) cameras in a stereo (or multi-stereo) configuration.

Folded optics: optical system in which the optical path is bent through reflective elements such as prisms or mirrors, in a way that the system thickness is changed to reach a certain thickness specification.

OTTL (Optical Total Track Length): length of the optical path followed by light from the point it comes into the optical system and to the point it reaches the sensor.

MTTL (Mechanical Total Track Length): total length of the device required to include the mechanical parts of the optical system.

Prism or mirror: refers to the optical component used to reflect the light at a certain angle, bending the optical path of the light.

SUMMARY OF INVENTION

With the aim of introducing the light-field technology into the smartphone market, a new concept of plenoptic camera is herewith presented, wherein a prism or mirror or other reflective element is used to fold the optical path of the lens, allowing to design lenses with large focal lengths without increasing the thickness of the lens.

A first aspect of the present invention refers to a plenoptic camera for mobile devices comprising a main lens, a microlens array, an image sensor, and a first reflective element (preferably a prism or a mirror) configured to reflect the light rays captured by the plenoptic camera before arriving at the image sensor, so as to fold the optical path of the light captured by the camera before impinging the image sensor.

In an embodiment, the first reflective element is arranged to receive the captured light rays before arriving at the main lens. In another embodiment, the first reflective element is arranged to receive the light rays already focused by the main lens. When only using one reflective element, the optical axis of the main lens is preferably parallel to the surface of the image sensor (in this way, the optical path is folded 90 degrees or any other arbitrary angle).

In another embodiment, the plenoptic camera comprises one or more further reflective elements (preferably prisms or mirrors) configured to reflect the light rays reflected by the first reflective element before arriving at the image sensor. The further reflective elements are therefore intercalated between the first reflective element and the image sensor, so as to further fold the optical path and help reducing the physical dimensions of the plenoptic camera in a determined axis.

The main lens may comprise a plurality of lens elements. In particular, the main lens may comprise a first set and a second set of lens elements, each set comprising one or more concentric lens elements. The physical arrangement of both sets of lens elements may be such that the optical axis of the first set of lens elements is perpendicular to the optical axis of the second set of lens elements and parallel to the image sensor. In an embodiment, the first reflective element is arranged between the first and the second set of lens elements. In another embodiment, the first reflective element is arranged to receive the captured light rays before arriving at the main lens, and the plenoptic camera comprises a second reflective element arranged between the first set and the second set of lens elements, wherein the second reflective element is configured to reflect the light rays reflected by the first reflective element and already focused by the first set of lens elements, before arriving at the image sensor.

Another aspect of the present invention refers to a camera module for mobile devices that comprises the plenoptic camera previously described. This camera module can be, for instance, a separate part directly integrated into a smartphone (e.g. inserted in the smartphone or attached to the back case of the smartphone) by coupling means and electrical contacts. In the camera module, the components of the plenoptic camera are arranged such that the thickness of the camera module is lower than 10 mm.

A further aspect of the present invention refers to a mobile device, preferably a smartphone, comprising the plenoptic camera or the camera module previously described. In the mobile device, the image sensor of the plenoptic camera may be arranged such that the perpendicular line of the image sensor is parallel to the back side of the mobile device. This way, the light path of the light rays captured by the camera is folded by the first reflective element (and, optionally, further reflective elements), which allows reducing the thickness of the mobile device. In the mobile device the components of the plenoptic camera are preferably arranged such that the thickness of the mobile device is lower than 10 mm.

BRIEF DESCRIPTION OF DRAWINGS

A series of drawings which aid in better understanding the invention and which are expressly related with embodiments of said invention, presented as non-limiting examples thereof, are very briefly described below.

DETAILED DESCRIPTION

Conventional cameras capture two-dimensional spatial information of the light rays captured by the sensor. In addition, colour information can be also captured by using the so-called Bayer pattern sensors or other colour sensors. However, no information about the direction of arrival of rays is recorded by a conventional camera. Plenoptic cameras have the capability of recording 3D information about the different objects. Basically, a plenoptic camera is equivalent to capturing the scene from several points of view (the so-called plenoptic views that act like several cameras distributed about the equivalent aperture of the plenoptic camera).

Figure 1A:
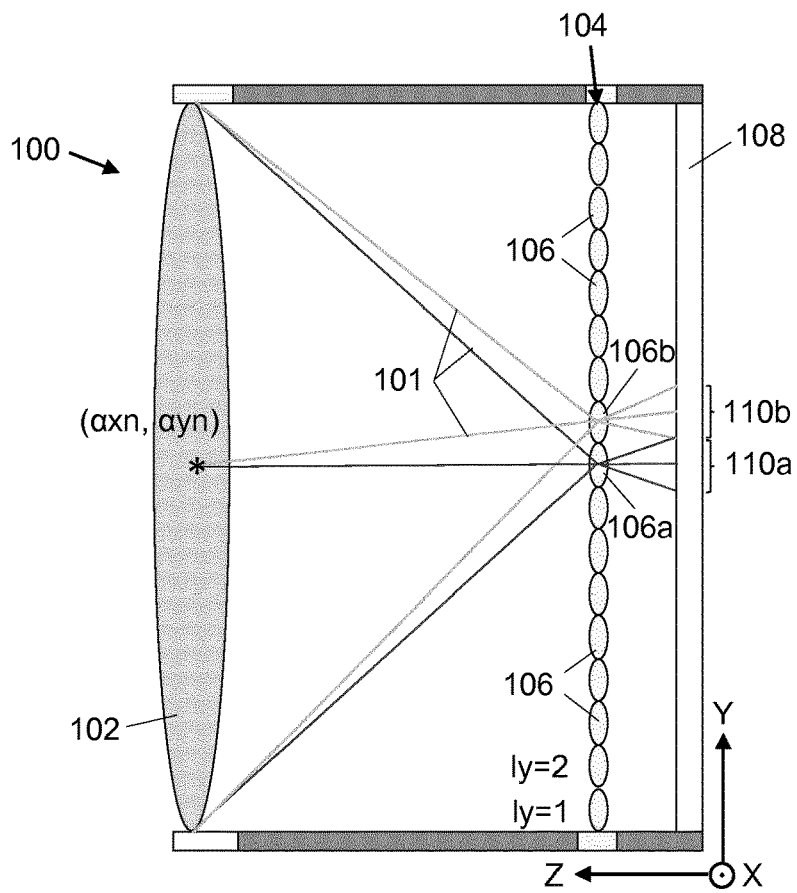
FIG. 1A represents a schematic side view of a plenoptic camera system with an image sensor, a microlens array and a field lens, according to the prior art.
Figure 1B:
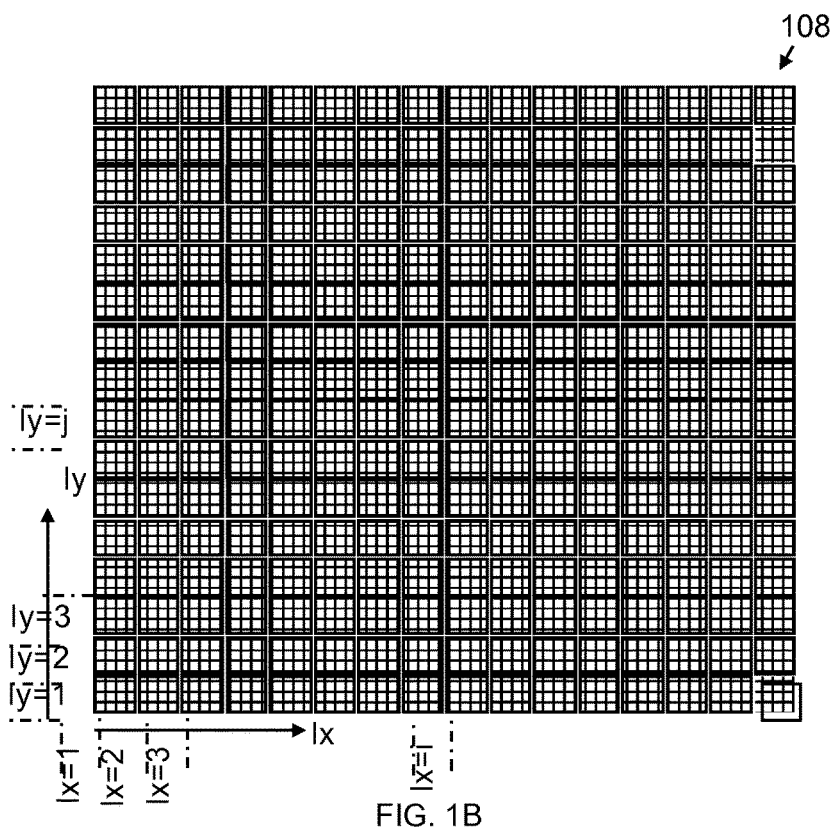
FIG. 1B depicts, in a front view, the microimages produced by the microlenses over the image sensor.
Figure 1C:
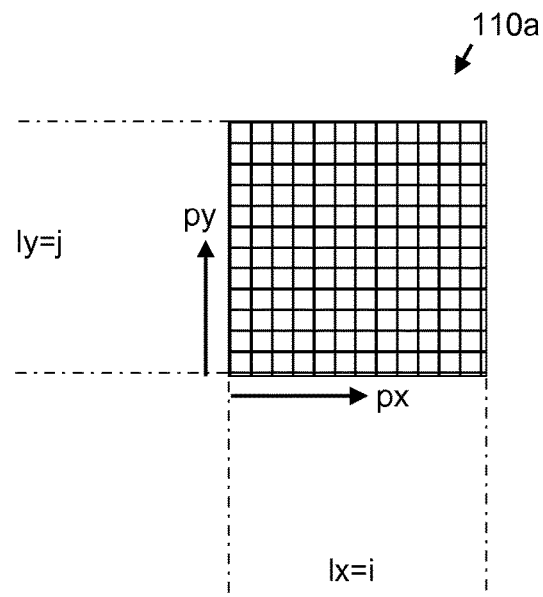
FIG. 1C shows the pixels forming one microimage of the image sensor.

Usually a plenoptic camera 100 (see FIG. 1A) is made by placing a microlens array 104 between the main lens 102 and the image sensor 108. Each of the microlenses 106 (lx,ly) is forming a small image, known as microimage (110*a*, 110*b*), of the main aperture onto the image sensor 108 (see FIGS. 1B and 1C), such that each pixel (px,py) of any microimage (110*a*, 110*b*) is capturing light rays 101 coming from a different part of the main aperture, every one of the microimages below any microlens is an image of the main lens aperture, and every pixel in position px1, py1 to pxn, pyn in every microlens 106 integrates light coming from a given part of the aperture (axn, ayn) irrelevant of the position of the microlens. Light crossing the aperture in position (axn, ayn) coming from different locations from the object world will hit different microlenses but will always be integrated by the pixel (pxn, pyn) below every microlens of the camera. Accordingly, the coordinates (px,py) of a pixel within a microimage determine the direction of arrival of the captured rays to a given microlens and (lx, ly) determine the two-dimensional spatial position. All this information is known as light field and can be represented by a four-dimensional matrix LF(px, py, lx, ly) or five-dimensional matrix LF (px, py, lx, ly, c) if the colour information (c) is considered.

As mentioned before, in some key aspects a plenoptic camera behaves like a multi-stereo camera (since both are multi-view systems) with a reduced baseline between views. That is, multi-stereo systems can also record the light-field. The behaviour of multi-stereo and stereo cameras has been widely studied. Articles like "Quantization Error in Stereo Imaging" [Rodriguez, J. J., & Aggarwal, J. K. Quantization error in stereo imaging. In Computer Vision and Pattern Recognition, 1988. Proceedings CVPR'88., Computer Society Conference on (pp. 153-158). IEEE] show how long focal lengths improve the depth error estimation in relatively long distances on multi-view systems.

Figure 2:
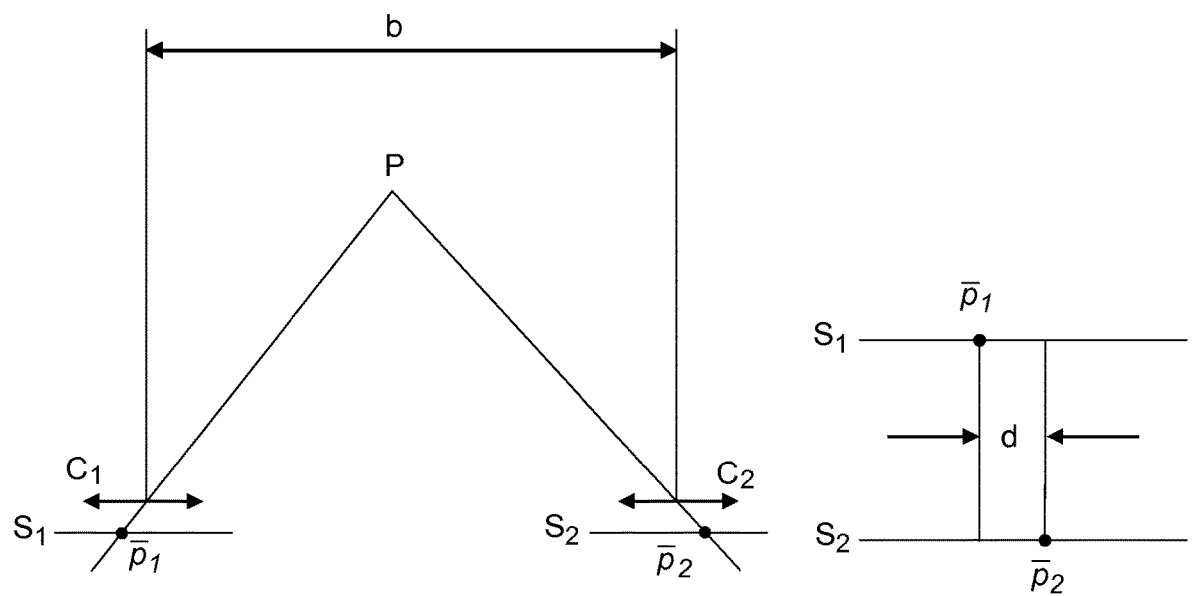
FIG. 2 illustrates the disparity between two projections of the same object point through two cameras separated from each other a baseline b.

The depth estimation of a stereo camera follows the equation:

$$z = \frac{bf}{d},$$

where z is the depth point of interest, b is the baseline, f the focal length of the cameras (if both cameras have the same focal length) and d the disparity. The disparity d represents the difference in position of two projections (or more projections in the case of a multi-stereo systems) of the same point in the object world, in the two (or more) cameras of a stereo (multi-stereo) system, as an example FIG. 2 shows two cameras separated from each other a baseline b, and how when the light from point P in the object world crosses the two equivalent lenses c1 and c2 from the two cameras and reaches the sensors s1 and s2 from the two cameras at two different positions of the sensors, the disparity d is the distance between the two images $\overline{p1}$ and $\overline{p2}$ of the same point P in the two sensors s1 and s2.

From previous equation, the depth estimation error can be calculated as:

$$\Delta z = \left|\frac{\partial z}{\partial d}\right| \Delta d = \left|-\frac{bf}{d^2}\right| \Delta d = \left|-\frac{z^2}{bf}\right| \Delta d$$

where $\Delta z$ represents the absolute error in depth, and $\Delta d$ represents the absolute disparity error.

A plenoptic camera follows the same equation for the error produced in depth computations. In this case, the baseline corresponds to the aperture size of the optical system (D).

$$\Delta z = \left|-\frac{z^2}{D \cdot f}\right| \cdot \Delta d = \frac{z^2 \cdot f\#}{f^2} \cdot \Delta d,$$

where f #=f/D (i.e. the f-number).

Figure 3:
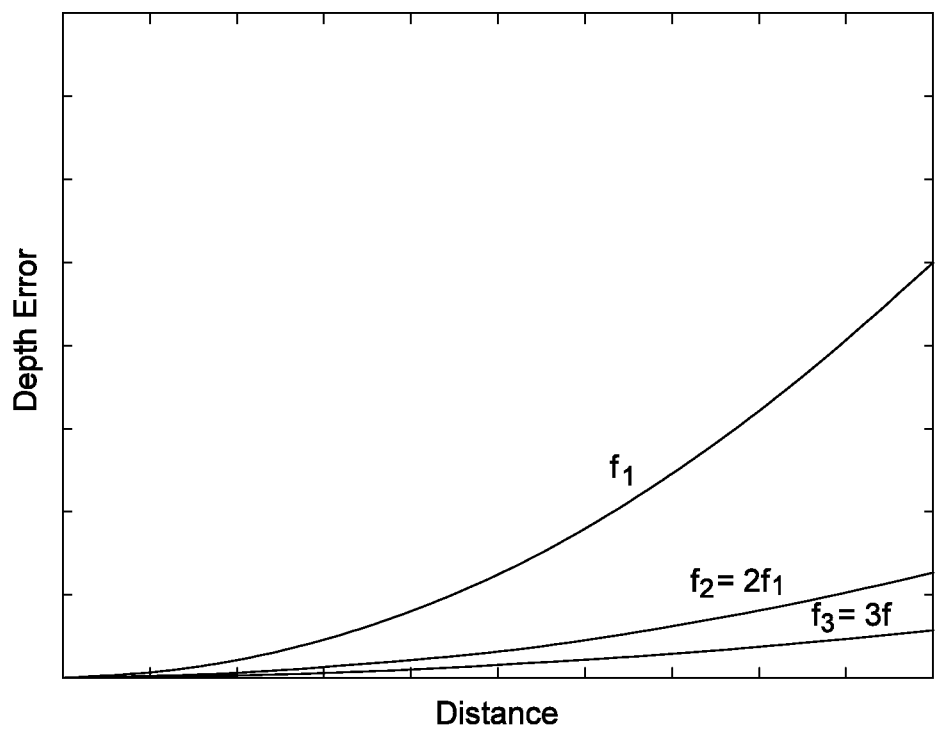
FIG. 3 shows the error in depth computations versus real distance of objects in the object world for different focal lengths in a plenoptic camera.

Hence, the depth error $\Delta z$ produced in a plenoptic camera can be reduced by increasing the focal length f of the optical system while maintaining the f-number, by reducing the f-number while keeping the focal length f (that is, increasing D), or by reducing the f-number at the same time that the focal length f is increased. Mobile phone lenses commonly are designed with small f numbers and small focal lengths (due to the restrictive thickness requirements of the mobile phone industry). Departing from an off-the-shelf design of a lens for a smartphone, which has a small f number and a small focal length, FIG. 3 shows how the depth estimation error is reduced quadratically with the increase of the focal length when the f number is kept. The error produced by focal length ($f_1$), which is a small focal length typically found in the mobile phone industry, is four times bigger than the error produced by focal length $f_2$ ($f_2$=2$f_1$), and nine times bigger than the error produced by $f_3$ ($f_3$=3$f_1$).

However, increasing the focal length generally means increasing the OTTL (optical total track length) of an optical system. Even if it depends on the particular optical design, the relation between focal length and OTTL approximately follows the expression $$1.1 < \frac{OTTL}{f} < 1.3$$

in unfolded configurations thus, an increase of the focal length involves a nearly proportional increase of the OTTL to keep f-number constant, and thus, an increase in MTTL (mechanical total track length), making the camera module (as the camera module 400 for smartphones depicted in FIG. 4) thicker (i.e. large Sz).

Figure 4:
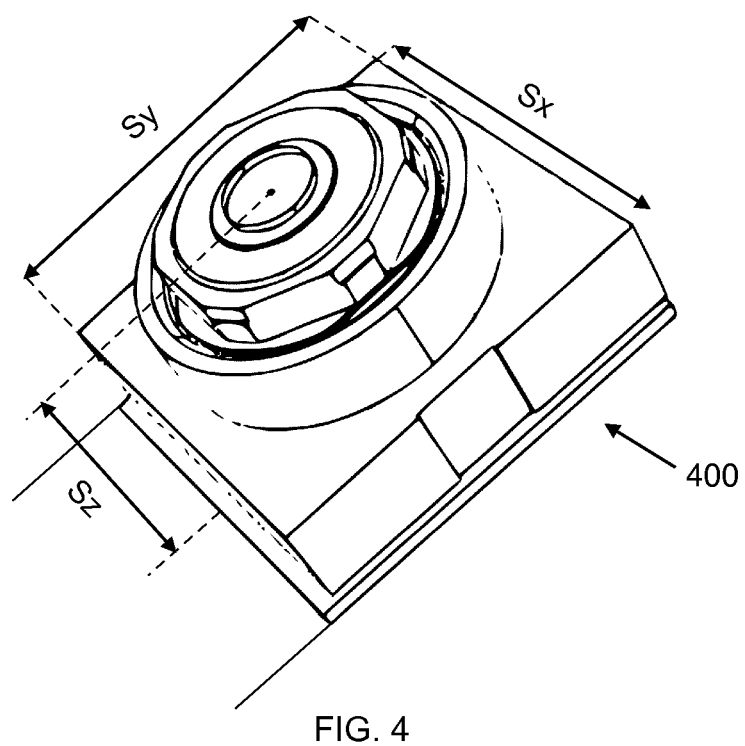
FIG. 4 shows a typical camera module for smartphones.

FIG. 4 shows a schematic of a typical camera module 400 for mobile devices, such as smartphones, with the aim of being illustrative but never limiting. The important dimensions have been highlighted (Sx×Sy×Sz). The typical dimensions of camera modules used in the mobile phone industry are the following: 4 mm<Sz<6.5 mm; 8 mm<Sy<10 mm; 8 mm<Sz<10 mm, where Sx, Sy and Sz correspond to the width, the height and the thickness of the camera module 400, respectively (according to axes X, Y and Z of FIG. 7).

Figure 7:
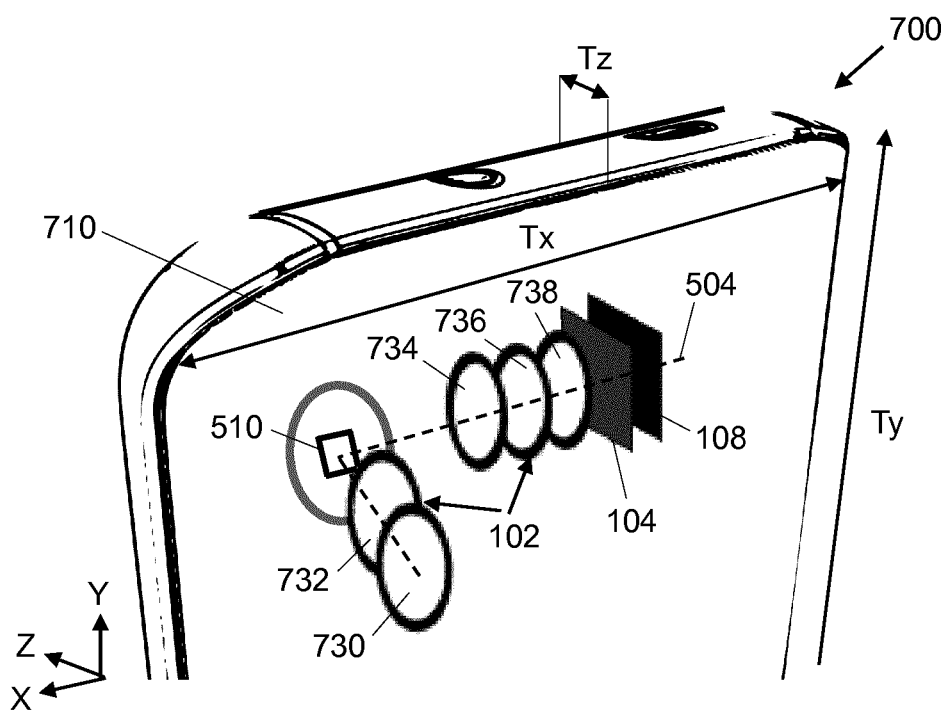
FIG. 7 shows a schematic example of a plenoptic camera according to the present invention installed within a smartphone.

The most critical dimension is Sz, which coincides with the MTz (Mechanical Track in z). This size Sz of the camera module 400 has to be smaller than the thickness Tz of the mobile device, as shown in FIG. 7, and mobile phone manufacturers tend to move to smaller thicknesses with each new phone generation. This means the cameras need to follow these trends if the aim is fitting them into the mobile device. Camera modules with thicknesses Sz higher than 10 mm would be severely rejected by the market, aiming to cameras with Sz approaching 5 and 4 mm.

Nowadays, smartphone market-trends demand reduced thickness Sz for mini cameras, which forces vendors to design lenses with very reduced focal lengths f to accomplish the client specs. Miniaturized plenoptic cameras (as the ones disclosed in patent document U.S. Pat. No. 9,647, 150B2), even if never launched commercially by anybody else with a form factor similar to FIG. 4, can have very improved performance if the focal length f is increased to values that are not commonly seen in conventional imaging lenses in the mini-camera industry. Thus, increasing the focal length of a specific plenoptical system without violating the smartphone market design rules (which require very small thicknesses) turns out imperative to improve the depth error precision and push the plenoptic mini-camera to the top-level of depth/3D cameras for portable devices.

A first approach to increase the focal length f is to scale all components of the optical system, increasing all the dimensions while keeping the f-number. This implies changing the main lenses, changing the microlenses and the sensor itself, so that, the OTTL and MTTL are also forced to increase dimensions, for sure exceeding the smartphone market requirements in terms of small thicknesses (Sz).

A second approach to increase the focal length f could be scaling the main lens but keeping the sensor and microlenses size. The focal length f of the plenoptic camera would increase, but, as the microlenses and sensor are kept the same size, the FOV (field of view) would be reduced due to the fact that the sensor is not capturing anymore the whole FOV of the optical system, but only a subset. And what is worse, in this case the OTTL and MTTL would be also increased leading to an increase in length of the main lens and making more difficult its use in mobile phone applications.

These approaches to increase the focal length f allow to improve the error in depth computations (they move the design point towards the lower curves in FIG. 3), making the camera more precise, with lower error percentages for the estimation of depths of objects located further from the camera (i.e. with longer distances in FIG. 3). However, the resulting OTTL and MTTL is increased and does not fit the restrictive thickness specs of the current smartphone mini-cameras, or in other words, a module as in FIG. 4 would have a thickness Sz too large to fit within a mobile phone.

In this context, in the present invention a prism or mirror is used to fold the optical path of the light, increasing the OTTL without increasing the thickness Sz of the camera module 400. Therefore, a novel plenoptic device with folded optic configurations is herewith presented.

Figure 5A:
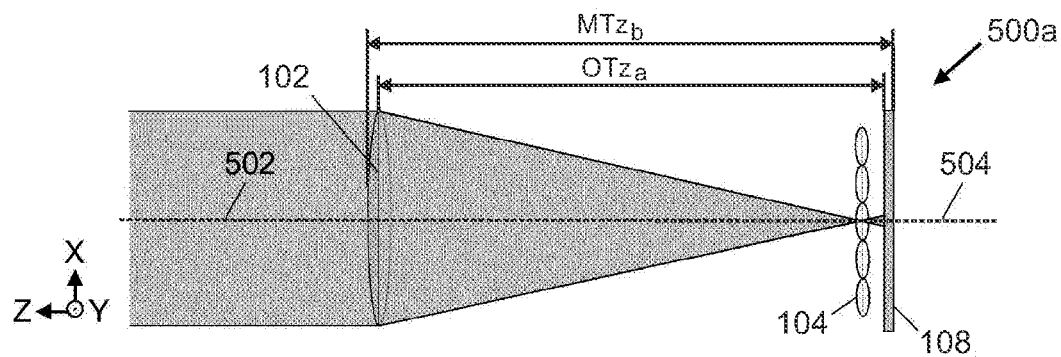
FIG. 5A depicts a plenoptic camera according to the prior art, with a pure plenoptic (unfolded) configuration.
Figure 5B:
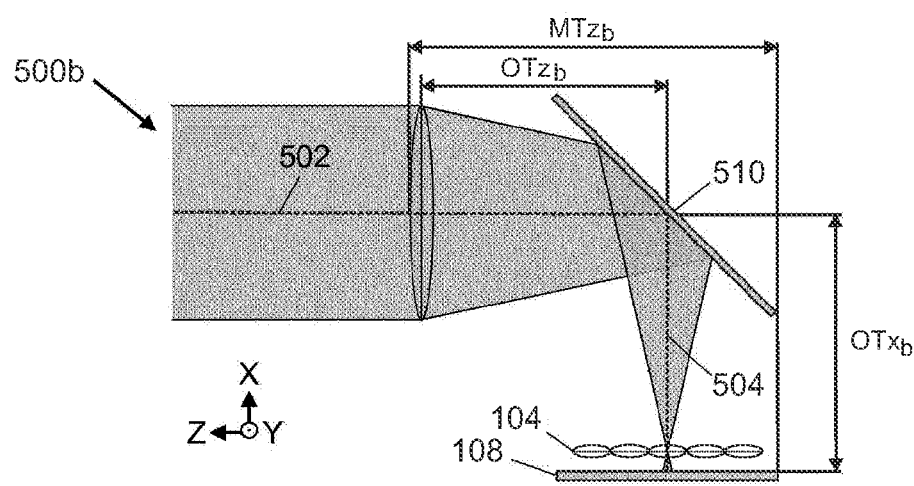
FIGS. 5B and 5C show a plenoptic camera according to two different embodiments of the present invention, with folded optics configuration.
Figure 5C:
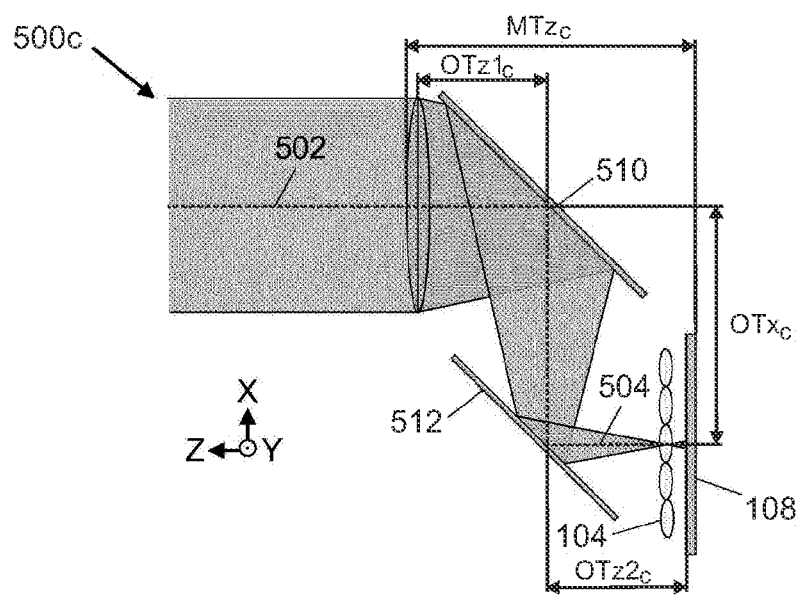

FIGS. 5A-5C show several embodiments of a plenoptic camera, showing the benefits of folded devices in terms of thickness. In all these embodiments, the main lens 102 is formed by a single lens element, or a pair or group of cemented lens elements. In these figures the term OT refers to optical track length and MT refers to mechanical track length. The mechanical track length in the Z axis (MTz) depicted in FIG. 7 is the critical dimension to consider when fitting the camera into a mobile phone since it corresponds to the thickness Tz of the device (or in other words, making thickness Sz as small as possible in the camera module 400 of FIG. 4). The three embodiments of FIGS. 5A-5C have the same optical performance in terms of focal length f and f-number, but different MTz.

FIG. 5A depicts a typical plenoptic camera 500a according to the prior art. The configuration of this plenoptic camera 500a is designed with a small f-number and a large focal length f with the purpose of obtaining a good depth error precision. The optical axis 502 of the main lens 102 is perpendicular to the image sensor 108, crossing the center of the image sensor 108 (i.e. the normal line 504 of the image sensor 108 at its central point is coincident with the optical axis 502). However, this configuration has a large $OTTL_a = OTz_a$, which implies a large $MTTL_a = MTz_a$ that does not fit within the typical dimensions of a smartphone.

FIG. 5B shows a plenoptic camera 500b according to an embodiment of the present invention. The plenoptic camera 500b depicted in FIG. 5B uses folded optics that reduces the MTz while keeping the same focal length (the OTTL and f-number remain the same as in FIG. 5A). In this configuration the optical path is bent using a reflective surface of a first reflective element 510, such as prism or mirror, thus the $OTTL_b$ has two components, $OTz_b$ and $OTx_b$, but the $OTTL_b$ is the same as used in FIG. 5A ($OTTL_b = OTTL_a = OTz_a = OTz_b + OTx_b$). In the configuration depicted in FIG. 5B, the optical axis 502 of the main lens 502 is parallel to the image sensor 108 (i.e. the optical axis 502 and the normal line 504 of the image sensor are perpendicular).

However, unlike the previous configuration, the MTz thickness of the camera module has been reduced enough to fit within the low thickness requirements of mini-camera specs while retaining the benefits of large focal lengths for plenoptic camera systems. Or, in other words, the plenoptic cameras 500a and 500b in FIGS. 5A and 5B offer the same optical performance and the same f number, however, the thickness of the plenoptic camera 500a in FIG. 5A is larger than the thickness of the plenoptic camera 500b in FIG. 5B ($MTz_a > MTz_b$) or, if implemented in a module like in FIG. 4, the thickness Sz would be smaller for the embodiment shown in FIG. 5B.

FIG. 5C represents a plenoptic camera 500c according to another embodiment of the present invention. This plenoptic camera 500c has a configuration where two reflective elements, a first reflective element 510 and a second reflective element 512, have been introduced to bend the optical path. The second reflective element 512 (such as a prism or a mirror) reflects the light rays which have been already reflected by the first reflective element 510. Additional reflective elements (e.g. a third reflective element, a fourth reflective element, etc.) may be used to further reflect the light rays reflected by the previous reflective elements positioned along the optical path. OTTL in FIG. 5C has three components $OTz_{1_c}$, $OTx_c$ and $OTz_{2_c}$ where their sum matches $OTTL_a$ ($OTTL_c = OTTL_a = OTz_{1_c} + OTx_c + OTz_{2_c}$) of FIG. 5A, so that the focal length remains constant, and the MTz has been drastically reduced ($MTz_c < MTz_b < MTz_a$). In the configuration shown in FIG. 5C, the optical axis 502 of the main lens 102 and the normal line of the image sensor 108 at its central point are parallel but not coincident (i.e. they are positioned at different heights), since the optical path has been folded twice along the way.

FIGS. 6A-6D show several embodiments of plenoptic camera devices (600a, 600b, 600c, 600d) with folded optics configuration, with the aim of being illustrative, but never limiting, where the main lens 102 is composed by a plurality of non-cemented lens elements or lens groups. The plenoptic camera devices shown in this figure are formed by an image sensor 108, a microlens array 104, an infrared filter 612 (an optional element that may not be present), and a main lens 102 composed by four or five lens elements, but it could be composed by fewer or more lens elements.

Each configuration shows a different MTz, the mechanical track length in the Z axis corresponding to the thickness Tz of the mobile device, as depicted in FIG. 7. Each figure represents the axes X, Y and Z corresponding to those shown in FIG. 7, according to the installation of the plenoptic camera in the mobile device (in FIGS. 6A-6C the image sensor 108 extends along the Z axis, whereas in the embodiment of FIG. 6D the image sensor 108 extends along the X axis). In all cases, the introduction of a first reflective element 510 (preferably a prism or mirror) that folds the light path reduces the MTz from the original non-folded configuration. As it can be seen from FIGS. 6A-6D, in all cases, MTz<OTTL, and of course, MTz<MTTL (considering the original non-folded configuration to compute the MTTL).

Figure 6A:
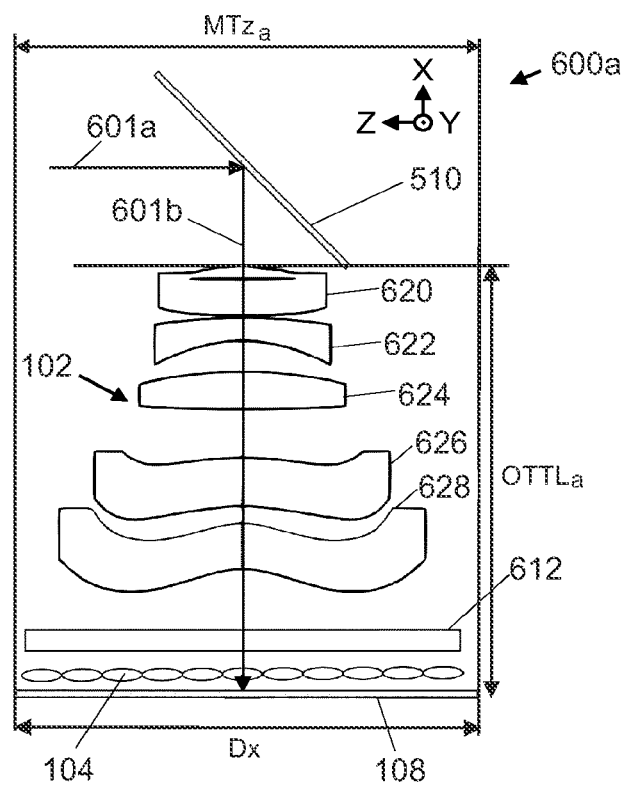
FIGS. 6A-6D show four different plenoptic camera embodiments according to the present invention.

In the first configuration, shown in FIG. 6A, the first reflective element 510, such as a prism or mirror placed at 45 degrees with respect to the optical axis, reflects the light rays 601a captured by the plenoptic camera 600a just before crossing any optical surface, i.e. before reaching any of the lens elements (620, 622, 624, 626, 628) of the main lens 102.

In the example of FIG. 6A the light rays 601b reflected from the first reflective element 510 (and forming a certain angle with respect to the captured light rays 601a) reach the main lens 102. It becomes very clear from the FIG. 6A that $MTz_a<OTTL_a$, what in practical terms means that the thickness Sz of the camera module 400 (FIG. 4) is smaller and easier to fit within the stringent requirements of a mobile phone.

Figure 6B:
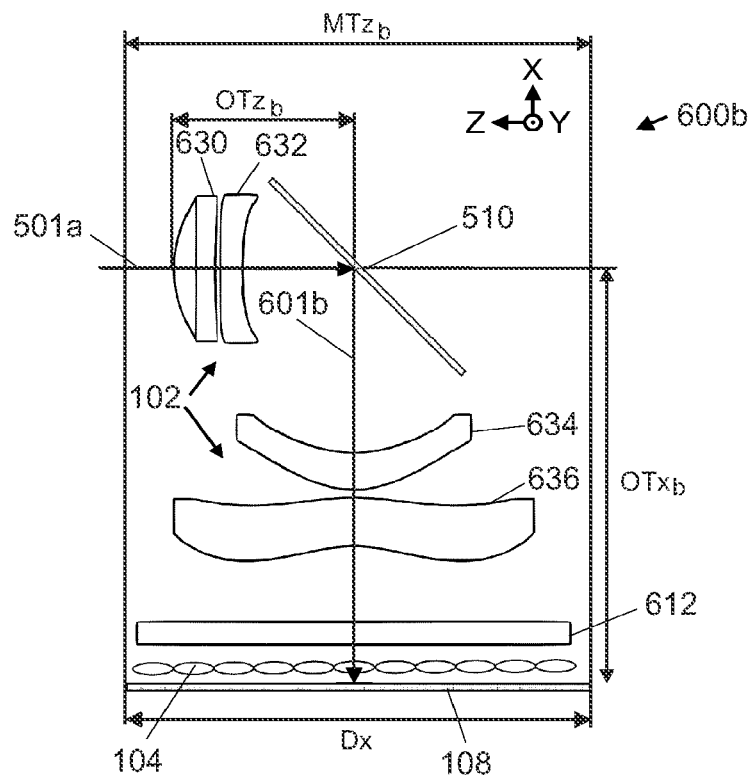
Figure 6C:
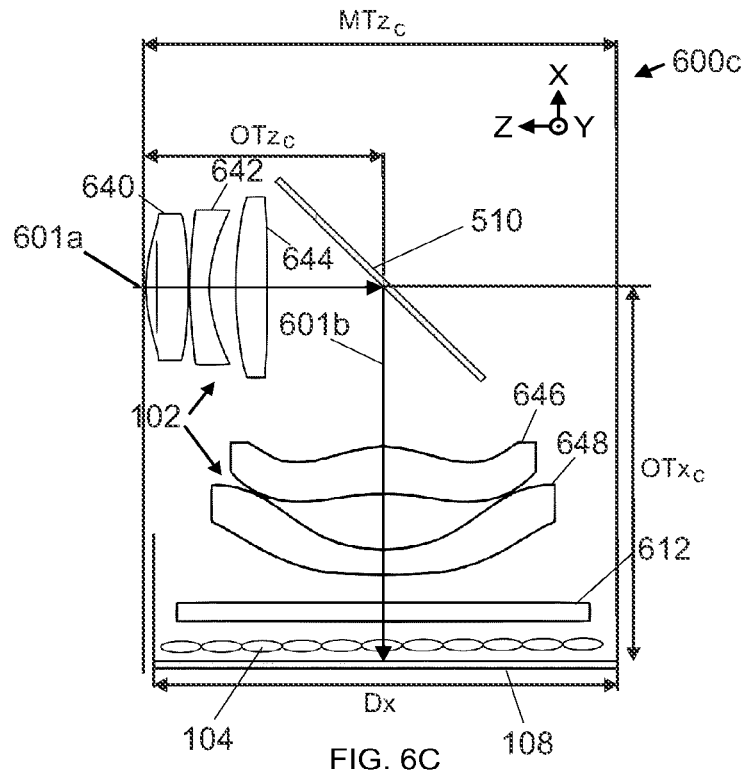

In the second configuration, depicted in FIG. 6B, the main lens 102 comprises a first set (630, 632) and a second set (634, 636) of lens elements. The plenoptic camera 600b of FIG. 6B bends the captured light rays 601a after they cross the first set of lens elements (the two first lenses 630 and 632) of the main lens 102 (in this case an achromatic doublet) with the help of a first reflective element 510, a prism or mirror, placed at 45 degrees with respect to the optical axes of both sets of lens elements. In this case, the $MTz_b=MTz_a$, and in both cases, it is limited by the sensor die dimensions (Dx in FIGS. 6A-6C). However, due to packaging reasons and/or due to the optical design, it might be better to fold the light after or before crossing several optical surfaces.

The third configuration (FIG. 6C) shows a main lens 102 formed by five lens elements divided into a first set (640, 642, 644) and a second set (646, 648) of lens elements. The captured light rays 601a are reflected after crossing the first set of lens elements (the first three lens elements 640, 642, 644), obtaining the reflected light rays 601b impinging on the second set (646, 648) of lens elements and the image sensor 108. Again, $MTz_c<OTTL=OTz_c+OTx_c$.

Figure 6D:
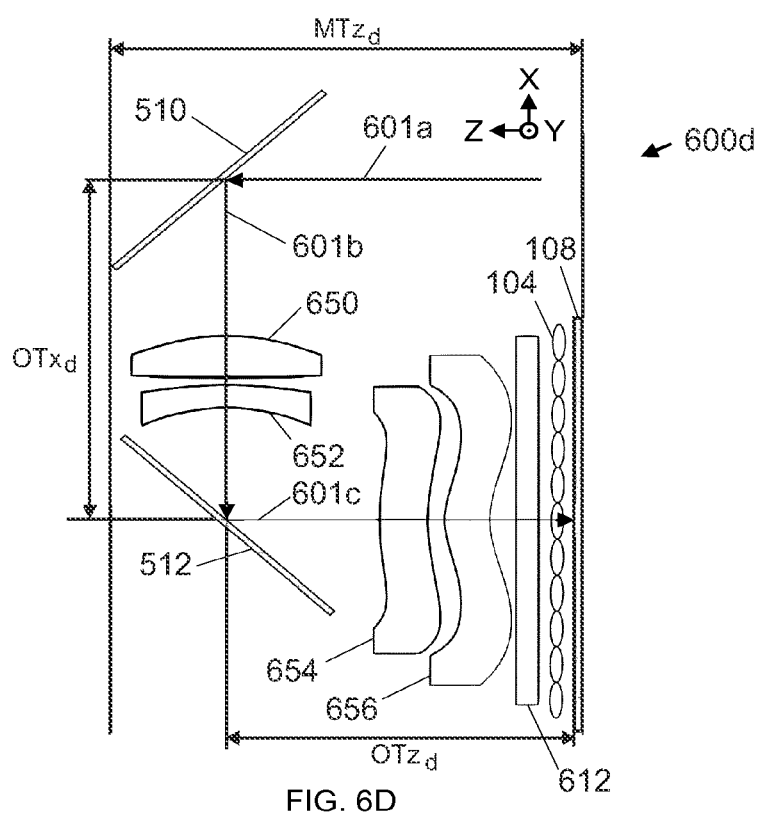

FIG. 6D shows a fourth configuration where, in addition to the first reflective element 510, a second reflective element 512 (e.g. a prism or mirror) is used to reduce the thickness MTz ($MTz<OTTL=OTx_d+OTz_d$). In this case, the sensor extends along the x dimension, and therefore its die dimension is not limiting the MTz. In this embodiment, the main lens 102 is formed by four lens elements divided into a first set (650, 652) and a second set (654, 656) of lens elements. The first reflective element 510 is arranged to receive the captured light rays 601a before it reaches the main lens 102, to obtain reflected light rays 601b. The second reflective element 512 is arranged between both sets of lens elements, and reflects the reflected light rays 601b to obtain further reflected light rays 601c that impinge on the second set (654, 656) of lens elements and the image sensor 108.

As explained in FIGS. 5A-5C and 6A-6D above, folded optics allows reducing thickness (MTz, or Sz in FIG. 4 and Tz in FIG. 7) of cameras with large focal lengths that commonly would lead to big Sz dimensions (high focal lengths can be fitted into really thin modules with low MTz or Sz, as shown in FIG. 6D, for example). As already said, in all cases of FIGS. 5B-5C and 6A-6D, the thickness of the camera is drastically reduced with respect to its original thickness (the MTTL in the equivalent unfolded configuration), allowing to fit large cameras into portable devices that, if it was not for the use of the folded optics technology, would never be able to accomplish the specs of smartphone industry in terms of thickness.

The plenoptic camera with reduced thickness proposed by the present invention is suitable to be installed on any mobile device with strict thickness constraints, such as a tablet, PDA or a smartphone. FIG. 7 shows an example of a plenoptic camera fitted into a smartphone 700 having a similar configuration as those depicted in embodiments of FIGS. 6B and 6C. As depicted in FIG. 7, the plenoptic camera is preferably installed at the rear part or back side 710 of the smartphone 700, capturing images from behind the screen. Alternatively, the plenoptic camera may be installed at the front side of the smartphone 700, next to the screen, to capture frontal images. The smartphone 700 has the following dimensions in the axes X, Y and Z represented in FIG. 7: a width Tx, a length Ty, and a thickness Tz, respectively. This example aims to be illustrative but not limiting. In this example, the main lens 102 of the plenoptic camera is formed by five lens elements (730, 732, 734, 736, 738), and a first reflective element 510 (a prism or mirror) reflects the light after it passes through a first set of lens elements (the first two lens elements 730 and 732) of the main lens 102, just like in the embodiment of FIG. 6B. The three other lens elements (734, 736, 738), forming the second set of lens elements, microlens array 104 and image sensor 108 are distributed along the X axis, not contributing to the thickness MTz of the camera (the critical size Sz in FIG. 4). These elements could instead be distributed along the Y axis, or in any arrangement such that the normal line 504 of the image sensor 108 and the optical axis of the second set of lens elements are parallel to the X-Y plane.

As a conclusion, this new proposed folded optics technique allows to have at the same time a superior plenoptic performance (with long focal lengths and small f number) and a small MTz (or thickness Sz of the camera module 400), being ideal for their integration in portable devices such as smartphones, tablets, laptops, etc.

FIGS. 8A-8D show four more embodiments of plenoptic camera devices (800a, 800b, 800c, 800d) with folded optics configurations where full folded plenoptic designs (including the first reflective element 510) have been further described with the aim of being illustrative but never limiting.

In these four embodiments a first prismatic lens 802 is used as the first reflective element 510 (and, optionally, a further (second, third ...) prismatic lens 812 is used as the second (third, fourth ...) reflective element 512). In this embodiment, the prismatic lens 802 (and, optionally, any further second, third, etc. prismatic lens/es 812 used) is basically a three-surfaces optical element in which the mid surface is reflective (e.g. a body or a prism in which the three surfaces can be aspheres instead of flat surfaces) made of glass or plastic. Two of the surfaces of the prismatic lens 802/812 (a first surface 804a/814a and a third 804c/814c surface) are refractive surfaces, and a middle, second surface 804b/814b is a reflective surface. Thus, the prismatic lens 802/812 is an optical element that integrates a lens element of the main lens (formed with the two refractive surfaces 804a/814a and 804c/814c) together with the reflective element 510/512 (formed by the reflective surface 804b/814b) that folds the light path. Light rays crossing the first surface 804a/814a of the prismatic lens 802/812 have a different optical axis (typically perpendicular) than the rays crossing the third surface 804c/814c due to the reflection produced in the second surface 804b/814b of the prismatic lens 802/812. The two refractive surfaces (804a/814a, 804c/814c) can have convex, concave or aspheric shapes, and the reflective surface might be planar or convex/concave, spherical or aspheric.

The use of prismatic lenses allows to fold the light path achieving long optical total track lengths OTTLs (and hence long effective focal length, EFFLs) within small thicknesses. Also, the integration of the prismatic lens 802/812 together with the other lens elements of the optical system is easier than using, for instance, a single mirror, where alignment tasks are for sure more difficult. The fact of having a prismatic lens 802/812 with its two well defined refractive surfaces (804a/814a, 804c/814c) and thus its well defined optical axes eases the alignment processes.

Several options and implementations of prismatic lenses have been integrated in the different embodiments of FIGS. 8A-8D and will be detailed below.

Figure 8A:
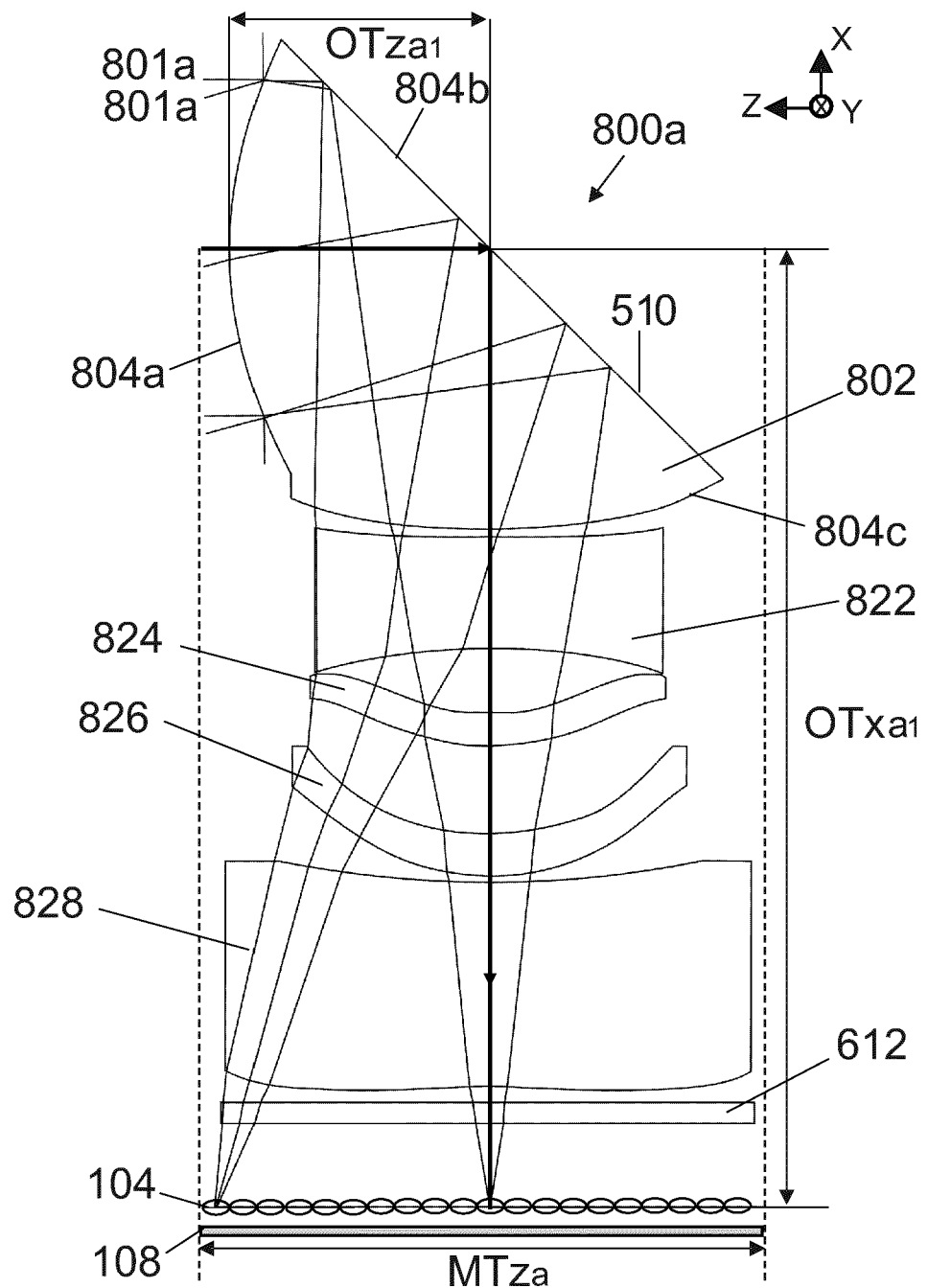
FIGS. 8A-8D show another four embodiments of plenoptic camera devices with folded optics configurations.

FIG. 8A shows a main lens containing five lens elements (802, 822, 824, 826, 828), an optional infrared filter 612, a microlens array 104 and an image sensor 108. The first lens element is a prismatic lens 802 that integrates within a single entity a convex lens (first 804a and third 804c surfaces) and the first reflective element 510 (second surface 804b). The first surface 804a has a convex shape (but it could be also concave or flat), the second surface 804b is a flat surface (but it could be any other non-flat surface) at 45-degrees (but might be other angles) as referred to the optical axis and this flat surface reflects the light towards the third surface 804c, a second convex surface (but it could be concave or flat). The first convex surface 804a of the prismatic lens 802 refracts the light rays 801a captured by the plenoptic camera 800a, next these rays are reflected by the first reflective element 510 (flat surface 804b) of the of the prismatic lens 802 a total of 90 degrees along the optical axis (but it could be different if the first reflective element 510 is not tilted 45 degrees with respect to the optical axis). The first optical axis extends along the Z axis and, after the reflective element 510, light follows a second optical axis (X axis), which is perpendicular to the first one, arriving at the third surface 804c of the prismatic lens 802. Light then crosses the other lens elements (822, 824, 826, 828), arriving at the microlens array 104, and finally to the image sensor 108.

The embodiment of FIG. 8A has an optical total track length OTTLa ($OTza_1+OTxa_1$) of 11.2 mm (but it could be longer or shorter); however, the use of the prismatic lens 802 to fold the light path allows extending most of the OTTL of the camera along the X axis, leading to a thickness of $MTz_a$ of around 5.1 mm (but it could be even shorter, or longer), making this lens with a very large OTTL suitable to be integrated into a mobile phone thanks to its reduced thickness. In this case the thickness (Z axis) is limited by the sensor size. Please, note the extreme field rays depicted in FIGS. 8A-D refer to the field at the sensor diagonal (although they lay in the plane XZ), leading to $MTz_s$ ($MTz_a$, $MTz_b$, $MTz_c$, $MTz_d$) that refer to the diagonal of the image sensor 108. This is a common practice in optical design since lenses usually have rotational symmetry, but the sensor is rectangular. This is the reason why the last lens diameter coincides with the height of the last ray crossing that last surface. This folded design allows to extend the focal length up to 9.3 mm (in this example, but it could be higher), improving drastically the depth sensing performance and still complying to the very small thickness requirements in mobile phones ($MTz_a$ of 5.1 mm).

The lens example of FIG. 8A should not be interpreted as a limiting choice, but only as an illustrative example of how a folded design can achieve large focal length and great depth performance with a small thickness. The main lens 102 of the camera may have more or less lens elements in order to improve the optical performance (in this example five lens elements, but it could be fewer or more lenses), the non-reflective surfaces of the prismatic lens 802 may be formed by convex surfaces, planar surfaces, concave surfaces or any aspheric surface the designer might consider appropriate. Also, the reflective element 510 (which in this case is a flat surface tilted 45-degrees with respect to the optical axis) might be a convex or a concave reflective surface (or a flat surface tilted any other angle versus the optical axis). The prismatic lens 802 may be located as a first lens element, or as a subsequent lens element, after one or more lens elements (e.g. as a second lens element).

Figure 8B:
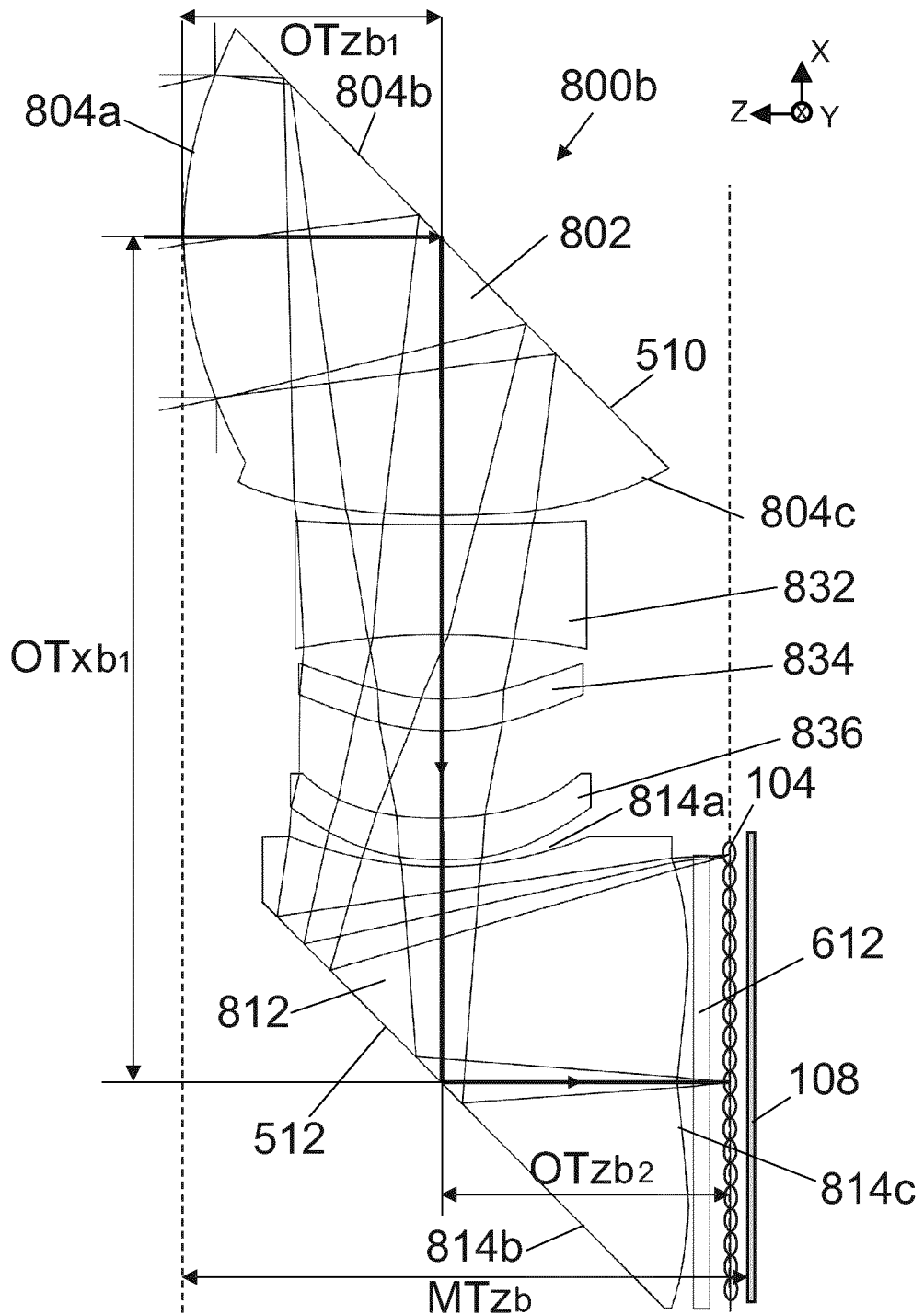

FIG. 8B shows an embodiment where two prismatic lenses (a first prismatic lens 802 and a second prismatic lens 812) have been used to fold the light path twice. In this case, the size of the image sensor 108 will not be liming the thickness of the lens as the image sensor 108 extends along the X and Y dimensions (is not anymore a limiting factor in the Z dimension: the sensor rectangle is extended along X-Y dimensions of FIG. 7 and we do not impose anymore that the sensor rectangular-die has to be smaller than Tz in FIG. 7, as is imposed by the embodiment in FIG. 8A). The main lens 102 is also formed by five elements (802, 832, 834, 836, 812), an optional infrared filter 612, the microlens array 104 and the image sensor 108. The first four lens elements (802, 832, 834, 836) are similar to the embodiment described in FIG. 8A. The fifth lens element is a second prismatic lens 812 with two refractive surfaces (first 814a and third 814c surfaces) having aspheric shapes, and a second reflective surface (in the example, a 45-degree flat surface) that acts as a second reflective element 512. In this case, the optical total track length OTTL of the lens ($OTzb_1+OTxb_1+OTzb_2$) is about 12.9 mm (but it could be longer or shorter). The use of folded optics allows to have a thickness $MTz_b$ of only a few millimeters (around 5.0 mm in the embodiment). Furthermore, the use of a second reflective element 512 allows to further increase the effective focal length EFFL (up to 13.2 mm in the example versus 9.3 mm in the embodiment from FIG. 8A), improving drastically the depth sensing performance of the plenoptic camera.

Again, the embodiment of FIG. 8B should not be interpreted as limiting, but only as an example. The lens may be formed by less or more elements than the five elements in the example, and by less or more than two reflective elements (510, 512), that may be either prisms or mirrors, or a combination of prisms and mirrors. The reflective element (510) and any other further reflective element (512) can reflect the incoming light rays with a 90 degrees angle or with any other arbitrary angle. The reflective elements can be arranged (i.e. tilted) so that the angle of incidence (and therefore the correspondent angle of reflection) of the incident light rays can be any angle comprised within the range (0-90), and preferably within the range [22.5-67.5]. In some embodiments, the angle of reflection is preferably 45°, thereby obtaining an optical path which is folded 90 degrees.

Figure 8C:
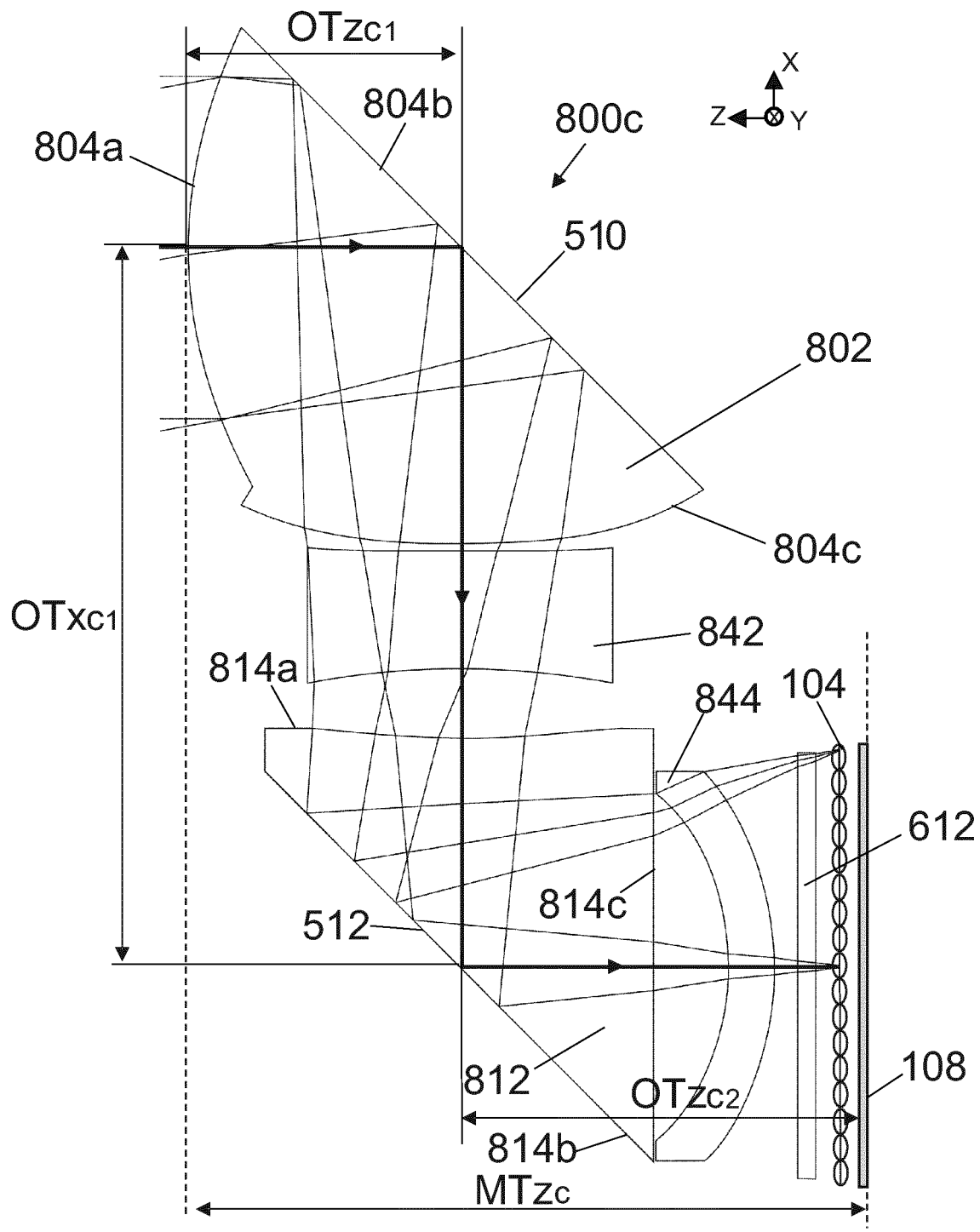

FIG. 8C shows an embodiment where two prismatic lenses (802, 812) have been integrated into a four-element lens, such that two lens elements of all the lens elements (802, 842, 812, 844) of the main lens 102 are prismatic lenses (802,812). Also, the camera 800c comprises an optional infrared filter 612, a microlens array 104 and an image sensor 108. The first prismatic lens 802 is similar to that in FIG. 8A. However, the second prismatic lens 812 is formed by a concave-planar lens as first 814a and the third 814c surfaces, and the reflective second surface 814b is a 45 degrees versus the optical axis flat surface. The second prismatic lens 812 is located between two regular aspheric lenses (842, 844). In this case, the main lens has an optical total track length OTTL ($OTzc_1+OTxc_1+OTzc_2$) of 12.0 mm with an effective focal length EFFL of 10.4 mm, and the thickness $MTz_c$ is 5.7 mm. In this case, the thickness MTz is limited by the size of the prismatic lenses (802, 812) and the thickness of the last regular lens element 844. If the priority is to reduce as much as possible the thickness MTz, the use of prismatic lens as first and/or last lens elements is clearly the best solution.

Figure 8D:
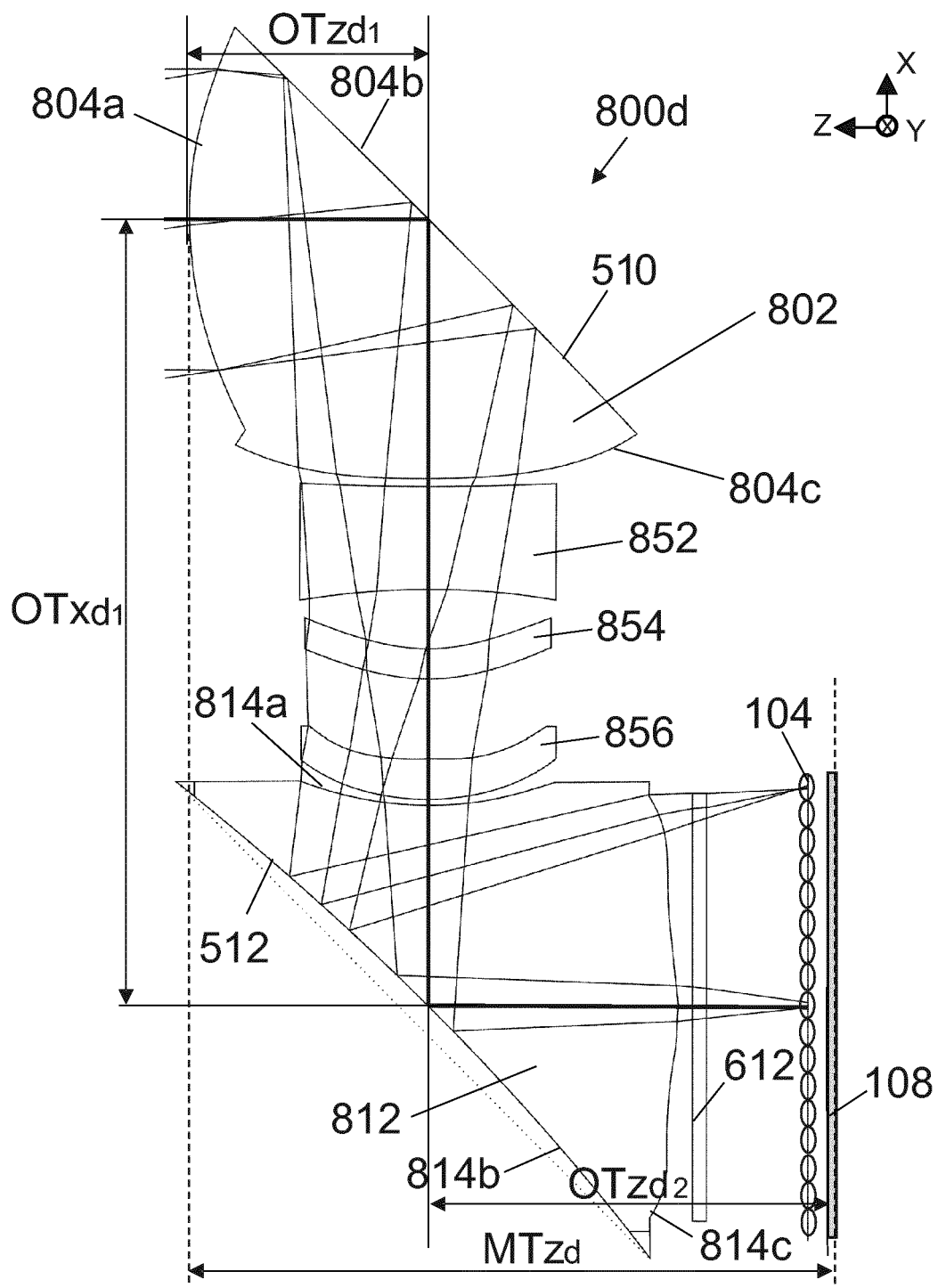

FIG. 8D shows another embodiment of plenoptic camera with folded optics configuration, where two prismatic lenses (802, 812) have been used in a main lens 102 composed of five lens elements (802, 852, 854, 856, 812). In this case, the first prismatic lens 802 is similar to that in FIG. 8A; however, a small concavity has been introduced in the reflective element 510 (so small that cannot be appreciated in the schematic of FIG. 8D). The second prismatic lens 812 integrates an aspheric lens and a concave reflective surface 814b (instead of flat as in embodiments 8A to 8C). The inclusion of non-planar reflective surfaces (804b, 814b) complicates the design but has manufacturing advantages. The main lens has an optical total track length OTTL ($OTZd_1+OTXd_1+OTZd_2$) of 14 mm, with an effective focal length EFFL of 12.4 mm. The thickness $MTz_d$ of the lens in this embodiment is 6.2 mm.

Figure 9:
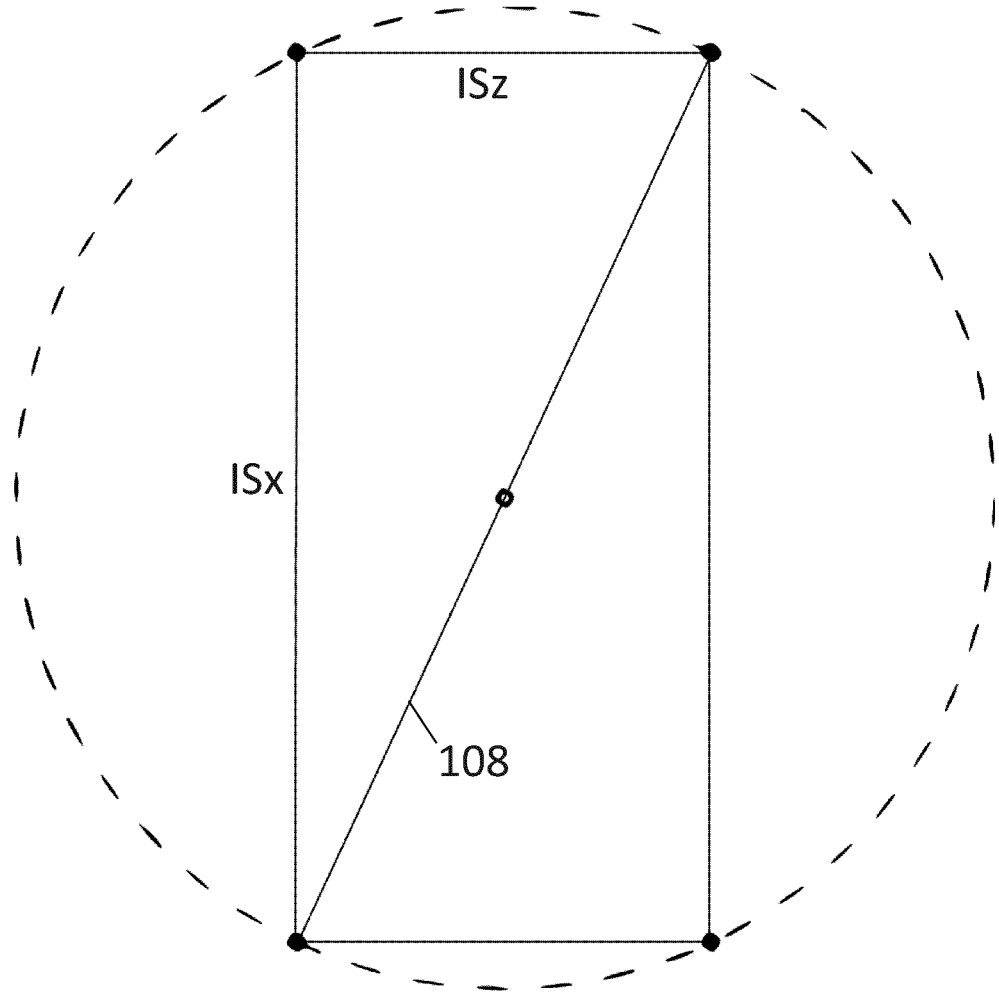
FIG. 9 shows an image sensor with its fitting image circle.

The use of one or more prismatic lenses (802, 812) allows to have large optical total track length OTTLs with small thicknesses $MTz_s$. In all cases, the thickness MTz is below 6.5 mm, and therefore it can be integrated in a modern mobile phone, where thickness as a usual practice never exceeds 7.5 mm for rear cameras and 5 mm for front cameras. Besides the prismatic lens technique or any other folded optics technique as previously described to reduce the thickness MTz of the device, other strategies might also be used to reduce the thickness of the device. As previously explained, lenses commonly have rotational symmetry, whereas image sensors 108 are not circular (they are rectangular). This means the lens has to be optimized to exhibit good optical performance along the whole diagonal of the image sensor 108 to ensure a good performance along the whole sensor, but part of the optimized field is wasted, due to the shape of the image sensor 108 (the light photons that hit inside the dotted circle in FIG. 9 but not within the rectangle of the active area of the sensor is not used, photons are not converted to electrons). FIG. 9 shows an image sensor 108 with side sizes ISz×ISx and its correspondent image circle. The diameter of the image circle is fixed by the diagonal of the active area of the sensor; however, since the sensor is rectangular a non-negligible part of the optimized field is wasted, and so, a non-negligible part of the area of the lenses is not being used for useful light hitting the active area of the sensor.

Figure 10A:
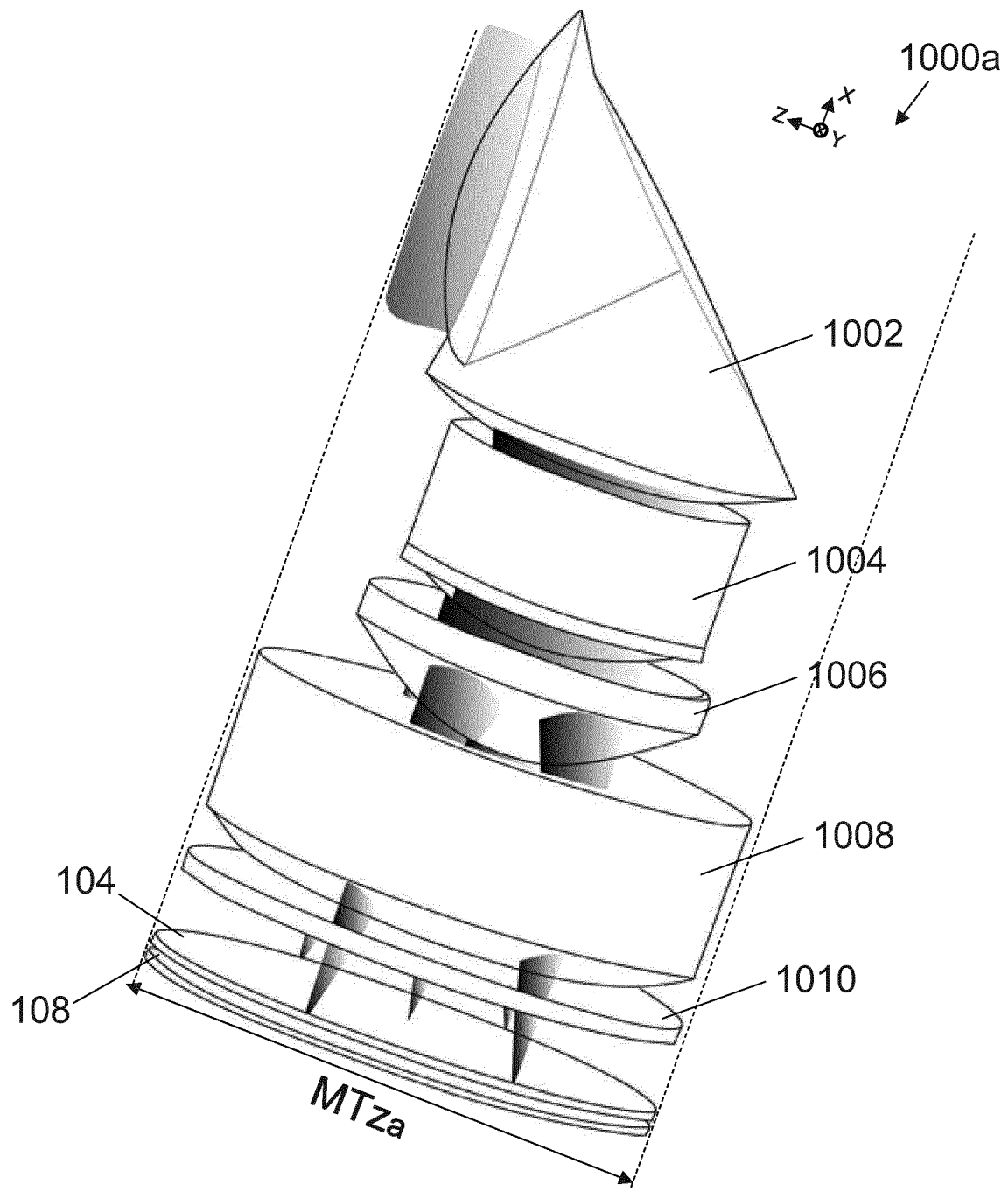
FIG. 10A shows a 3D view of a plenoptic camera with folded optics configuration.
Figure 10B:
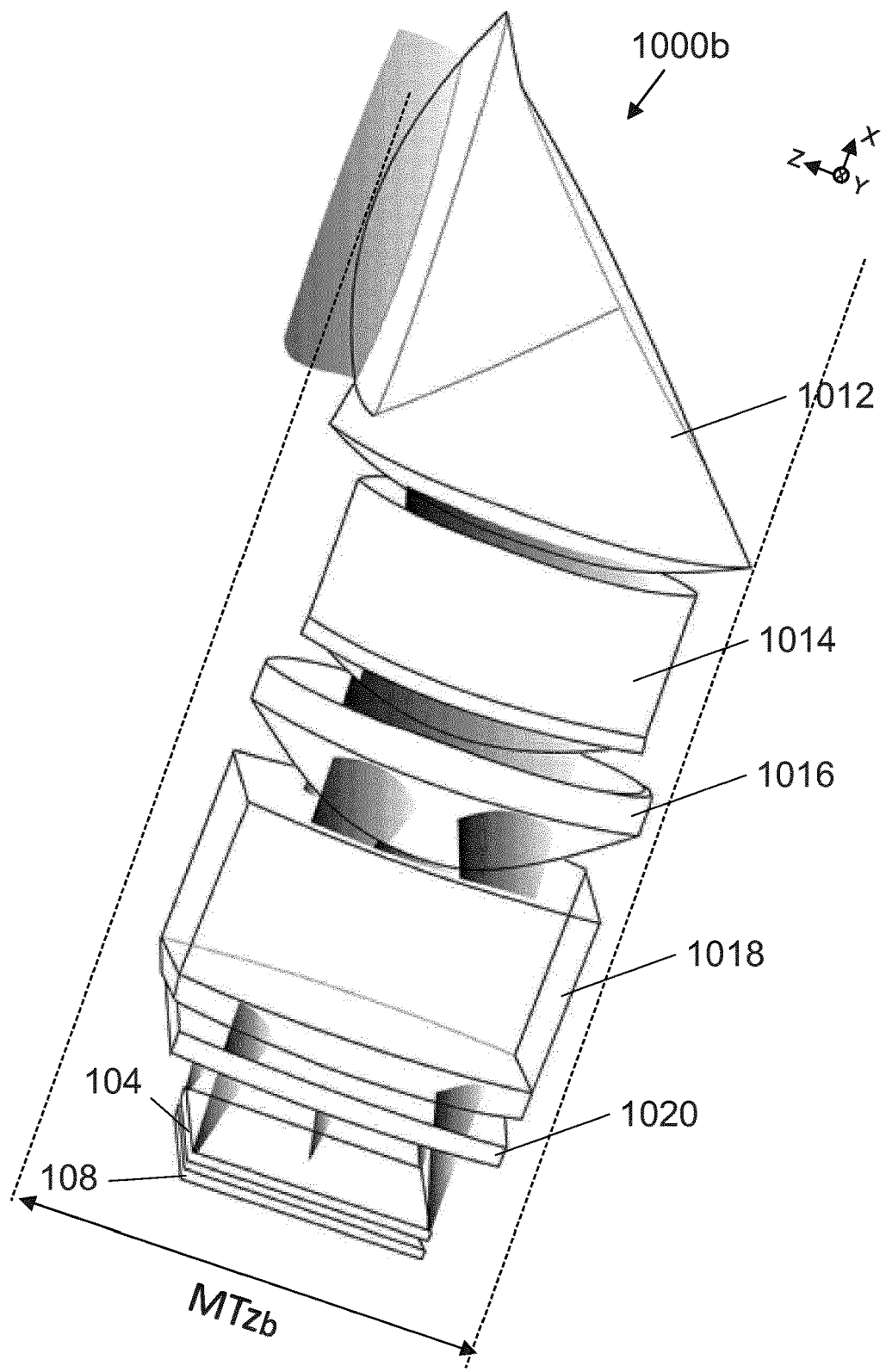
FIG. 10B shows a 3D view of a plenoptic camera with folded optics configuration where the lenses have been cut to reduce the thickness of the device in the Z axis.

FIG. 10A shows a plenoptic camera 1000a where as in any normal camera the rotational symmetry of the lenses produces an image circle hitting the microlens array (104) and finally hitting the image sensor (108) that in FIG. 10A is like the circle in FIG. 9, but in fact the image sensor 108 and the microlens array 104 are rectangles as in FIGS. 9 and 10B, and the light hitting inside the circle but outside the rectangle of the image sensor 108 does not have any useful role. FIG. 10A shows a folded-plenoptic camera with five lens elements (1002, 1004, 1006, 1008, 1010), in which four different rays are depicted reaching the four corners of the image sensor 108, limiting the field of view (FOV) of the plenoptic camera 1000a (the light at the very center of the FOV reaching the center of the image sensor 108 is also depicted in FIG. 10A).

Light reaching surface of the microlens array 104 in FIG. 10A outside the rectangle formed by the four points limiting the FOV does not offer any use. In FIG. 10B only the active area of the image sensor 108 (where photons are converted to electrons) and the microlens array 104 is depicted. The lenses 1008 and 1010 in FIG. 10A have also been truncated in FIG. 10B (truncated lenses 1018 and 1020), eliminating the part of those lenses that would convey light to the circle but outside the rectangle in FIG. 9 (i.e. outside the active area of the sensor).

The net result is that plenoptic cameras 1000a and 1000b are functionally identical, but in camera 1000a the MTTL (the thickness $MTz_a$) is fixed by the outside circle of lenses 1008 and 1010 (or by the outside circle of FIG. 9), while in camera 1000b the MTTL (thickness $MTz_b$) is fixed by the lens 1012 (exactly the same as lens 1002 in camera 1000a, larger in the z-dimension than the truncated lenses 1018 and 1020).

To sum up, and as shown in the embodiments of FIGS. 8A-8D, there are a lot of degrees of freedom for the design of the main lens. The refractive surfaces (804a, 804c; 814a, 814c) of the prismatic lens can be concave, convex, planar, aspheric or any combination thereof. The reflective surface (804b; 814b) can be planar or convex/concave, and they can be at any tilting degree (not necessarily 45 degrees vs the optical axis as shown in most figures). Prismatic lenses can be located as the first lens element of the main lens, as the last lens element of the main lens or between regular element lenses of the main lens, depending on the particular needs of the design. The number of prismatic lenses can also be variable (one, two or more prismatic lenses may be used). And, furthermore, the lenses may be cut to reduce thickness.

The embodiments shown in the Figures of this document are only examples that should not be interpreted as a limiting feature, the extent of the invention should only be extracted from the claims, as there is an unlimited number of possible embodiments that cannot be covered with examples but become evident for an expert in the matter after having access to the present invention. For example, in all the changes of direction of propagation of light at the reflective surfaces in FIGS. 5B, 5C, 6A, 6B, 6C, 6D, 7, 8A, 8B, 8C, 8D, 10A and 10B the incident and the reflected rays are perpendicular; however practical design with different incident and reflected angles might be convenient for some applications. For example in some silicon sensors the active photosensitive area is not perfectly centered within the silicon die area, and for example in plenoptic camera 1000b it might be convenient to move the silicon sensor 108 a bit towards the right or towards the left, we could do that by building the reflective surface in lens 1012 at angles slightly higher or lower than 45 degrees vs the optical axis of the first surface of lens 1012 (obviously in this case the sensor would not be perfectly parallel or perpendicular to the outside frame of the mobile phone, but we would fix a miniaturization problem).

The invention claimed is:

1. A plenoptic camera comprising
a main lens,
a microlens array,
an image sensor,
a first reflective element configured to reflect light rays captured by the plenoptic camera before arriving at the image sensor,
at least one further reflective element configured to reflect the light rays reflected by the first reflective element before arriving at the image sensor, and at least one further three-sided optical element having two refractive surfaces forming a lens element of the main lens and a reflective surface forming the at least one further reflective element.

2. The plenoptic camera of claim 1, further comprising a three-sided optical element having two refractive surfaces forming a lens element of the main lens and a reflective surface forming the first reflective element.

3. The plenoptic camera of claim 2, wherein the three-sided optical element is made of glass or plastic.

4. The plenoptic camera of claim 2, wherein the refractive surfaces of the three-sided optical element are planar surfaces, convex surfaces, concave surfaces, aspheric surfaces or a combination thereof.

5. The plenoptic camera of claim 2, wherein the reflective surface of the three-sided optical element is a planar surface, a convex surface or a concave surface.

6. The plenoptic camera of claim 1, wherein the first reflective element is a prism.

7. The plenoptic camera of claim 1, wherein the first reflective element is a mirror.

8. The plenoptic camera of claim 1, wherein the first reflective element is arranged to receive the captured light rays before arriving at the main lens.

9. The plenoptic camera of claim 1, wherein the first reflective element is arranged to receive the light rays after being refracted by at least one lens element of the main lens.

10. The plenoptic camera of claim 1, wherein the optical axis of the first lens element of the main lens is parallel to the image sensor.

11. The plenoptic camera of claim 1, wherein the at least one further three-sided optical element is made of glass or plastic.

12. The plenoptic camera of claim 1, wherein the refractive surfaces of the optical element are planar surfaces, convex surfaces, concave surfaces, aspheric surfaces or a combination thereof.

13. The plenoptic camera of claim 1, wherein the reflective surface of the optical element is a planar surface, a convex surface or a concave surface.

14. The plenoptic camera of claim 1, wherein the at least one further reflective element is a prism or a mirror.

15. A plenoptic camera comprising
a main lens,
a microlens array,
an image sensor,
a first reflective element configured to reflect light rays captured by the plenoptic camera before arriving at the image sensor,
wherein the main lens comprises a plurality of non-cemented lens elements.

16. The plenoptic camera of claim 15, wherein at least one of the lens elements of the main lens is non-rotationally symmetric, such that the field of said at least one lens element is adapted to the dimensions (ISz, ISx) of the image sensor.

17. The plenoptic camera of claim 15, wherein the main lens comprises a first set and a second set of lens elements, each set comprising one or more concentric lens elements; and
wherein the optical axis of the first set of lens elements is perpendicular to the optical axis of the second set of lens elements and parallel to the image sensor.

18. The plenoptic camera of claim 17, wherein the first reflective element is arranged between the first and the second set of lens elements.

19. The plenoptic camera of claim 17, wherein the first reflective element is arranged to receive the captured light rays before arriving at the main lens;
wherein the plenoptic camera comprises a second reflective element arranged between the first set and the second set of lens elements, the second reflective element being configured to reflect the light rays reflected by the first reflective element and already refracted by the first set of lens elements, before arriving at the image sensor.

20. A camera module for mobile devices, comprising a plenoptic camera comprising
a main lens,
a microlens array,
an image sensor,
a first reflective element configured to reflect light rays captured by the plenoptic camera before arriving at the image sensor,
wherein the components of the plenoptic camera are arranged such that a thickness (Sz) of the camera module is lower than 10 mm.

21. A mobile device comprising a plenoptic camera comprising
a main lens,
a microlens array,
an image sensor,
a first reflective element configured to reflect light rays captured by the plenoptic camera before arriving at the image sensor,
wherein the image sensor of the plenoptic camera is arranged on the mobile device such that the normal line of the image sensor is parallel to the back side of the mobile device.

22. The mobile device of claim 21, wherein the components of the plenoptic camera are arranged such that the thickness (Tz) of the mobile device is lower than 10 mm.

23. The mobile device of claim 21, wherein the mobile device is a smartphone.

* * * * *